United States Patent
Nilles et al.

(10) Patent No.: US 10,128,833 B2
(45) Date of Patent: Nov. 13, 2018

(54) MILLIVOLT POWER HARVESTING FET CONTROLLER

(71) Applicant: TEXAS INSTRUMENTS INCORPORATED, Dallas, TX (US)

(72) Inventors: Jeff L. Nilles, Los Altos, CA (US); Noman A. Paya, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/495,538

(22) Filed: Apr. 24, 2017

(65) Prior Publication Data

US 2017/0230048 A1 Aug. 10, 2017

Related U.S. Application Data

(63) Continuation-in-part of application No. 15/221,328, filed on Jul. 27, 2016.

(60) Provisional application No. 62/199,804, filed on Jul. 31, 2015.

(51) Int. Cl.
  *H03K 3/00* (2006.01)
  *H03K 17/687* (2006.01)
  *H02M 3/07* (2006.01)

(52) U.S. Cl.
  CPC ............ *H03K 17/687* (2013.01); *H02M 3/07* (2013.01)

(58) Field of Classification Search
  CPC ................................ H03K 17/687; H02M 3/07
  See application file for complete search history.

(56) References Cited

U.S. PATENT DOCUMENTS

| | | |
|---|---|---|
| 5,539,610 A | 7/1996 | Williams et al. |
| 5,654,628 A | 8/1997 | Feldtkeller |
| 5,939,867 A | 8/1999 | Capici et al. |
| 6,040,736 A | 3/2000 | Milanesi et al. |
| 6,127,745 A | 10/2000 | Bolz |
| 6,204,700 B1 | 3/2001 | Seyed |
| 6,747,880 B2 | 6/2004 | Grover |

(Continued)

FOREIGN PATENT DOCUMENTS

| | | |
|---|---|---|
| EP | 2128984 A1 | 12/2009 |
| RU | 114182 U1 | 3/2012 |

(Continued)

OTHER PUBLICATIONS

Search Report for PCT/US16/45058, dated Nov. 17, 2016 (1 page).

(Continued)

*Primary Examiner* — Kenneth B Wells
(74) *Attorney, Agent, or Firm* — William B. Kempler; Charles A. Brill; Frank D. Cimino

(57) ABSTRACT

Circuits and methods for controlling a transistor that has first, second and third terminals, wherein a voltage level at said first terminal controls in part a current flow from said second terminal to said third terminal. A controller receives an voltage existing across the second and third terminals of the transistor, generates an isolated voltage and uses that voltage to power components of the controller. The controller provides a voltage to the first terminal of the transistor, whereby the controller regulates the voltage across the second and third terminals of the transistor by regulating the voltage provided to the first terminal.

21 Claims, 1 Drawing Sheet

(56) References Cited

U.S. PATENT DOCUMENTS

| | | | |
|---|---|---|---|
| 7,009,370 B2 * | 3/2006 | Deaton | H02M 3/1584 323/272 |
| 7,119,606 B2 | 10/2006 | Fahim | |
| 7,129,766 B2 | 10/2006 | Steinhagen | |
| 7,466,573 B2 | 12/2008 | Kojori et al. | |

FOREIGN PATENT DOCUMENTS

| | | |
|---|---|---|
| SU | 1476446 A1 | 4/1989 |
| WO | 2014178529 A1 | 11/2014 |

OTHER PUBLICATIONS

Semyan A.P. 500 skhem dlya radiolyubitelei. Istochniki pitaniya, SPB, Nauka i tekhnika, 2005 (3 pages).
English Machine Translation, RU114182U1 (4 pages).
English Machine Translation, SU1476446A1 (5 pages).
Supplementary European Search Report, date of completion Jun. 11, 2018 (1 page).

* cited by examiner

MILLIVOLT POWER HARVESTING FET CONTROLLER

PRIORITY CLAIM

This application is a continuation-in-part of U.S. patent application Ser. No. 15/221,328 filed Jul. 27, 2016, which claims priority under 35 U.S.C. 119(e) to U.S. Provisional Patent Application 62/199,804, entitled "Millivolt Power Harvesting FET Controller," filed Jul. 31, 2015, the entire contents of which are hereby expressly incorporated herein by reference.

BACKGROUND

Battery powered devices often include electronic safeguards to prevent damage to the internal electronics in the event of reverse battery installation, accidental short circuiting, or other inappropriate operation. Such electronic safeguards ensure that any reverse current flow and reverse bias voltage is low enough to prevent damage to either the battery itself or the device's internal electronics. One front-end component that manufacturers often employ to effect reverse battery protection is the series diode. In higher power systems (e.g., two amps or higher), the voltage drop across a series diode can cause excessive amounts of power dissipation. More recently, field-effect transistors have been employed to implement reverse battery protection. The most recent metal-oxide-semiconductor field-effect transistors (MOSFETs) have very low resistance and are therefore ideal for providing reverse current protection with minimal loss. However, the use of a FET to protect the battery during reverse current situations involves the use of a controller to regulate the voltage drop across the FET, and the controller itself consumes marginal power.

SUMMARY

An illustrative aspect of this disclosure is directed to a circuit that includes a transistor and a controller. The transistor has first, second and third terminals, wherein a voltage level at said first terminal controls in part a current flow from said second terminal to said third terminal. The controller receives a voltage existing across the second and third terminals of the transistor and uses that voltage to power components of the controller. The controller provides a voltage to the first terminal of the transistor, whereby the controller regulates the voltage across the second and third terminals of the transistor by regulating the voltage provided to the first terminal.

Another illustrative aspect of this disclosure is directed to a circuit that includes a transistor and a controller. The transistor has first, second and third terminals, wherein a voltage level at said first terminal controls in part a current flow from said second terminal to said third terminal. The controller includes a voltage converter and a control circuit. The voltage converter receives a voltage existing across the second and third terminals of the transistor and converts that voltage to a power supply voltage that is a higher voltage than the received voltage. The control circuit is powered by the power supply voltage. The control circuit receives the voltage existing across the second and third terminals of the transistor and provides a control voltage to the first terminal of the transistor. The control circuit regulates the voltage across the second and third terminals of the transistor by regulating the control voltage provided to the first terminal.

Another illustrative aspect of this disclosure is directed to a method of controlling a transistor comprising first, second and third terminals, wherein a voltage level at said first terminal controls in part a current flow from said second terminal to said third terminal. Pursuant to said method, a voltage existing across the second and third terminals of the transistor is received. The voltage existing across the second and third terminals of the transistor is used to power a control circuit. The control circuit generates a control voltage based on the voltage existing across the second and third terminals of the transistor. The control circuit provides the control voltage to the first terminal of the transistor.

BRIEF DESCRIPTION OF THE DRAWINGS

FIG. 4 is the same circuit shown in FIG. 1, except that the battery and load are isolated from ground.

DETAILED DESCRIPTION

Figure 1:
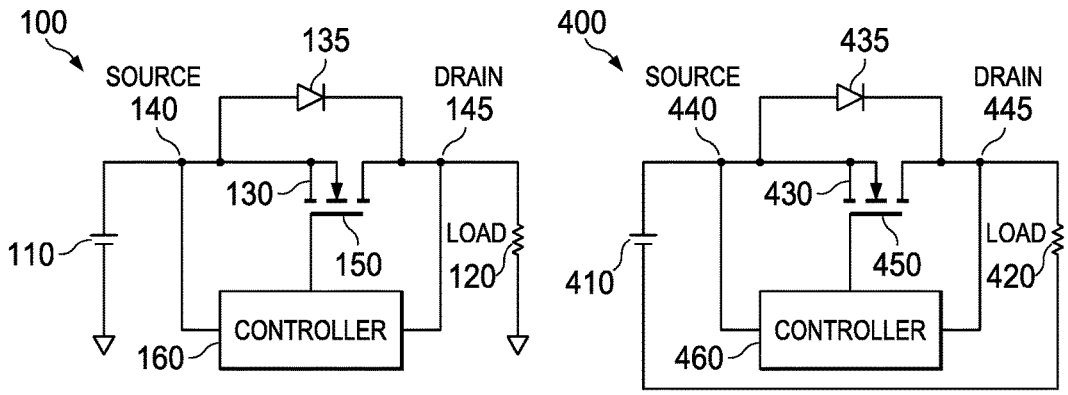
FIG. 1 is a schematic circuit diagram of a circuit that includes a battery powering a load and that employs a transistor serving as reverse-current protection.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Illustrative aspects of the present disclosure are directed generally toward powering a transistor controller using the voltage existing across the terminals of the transistor being controlled. This general concept of the present disclosure is described herein with respect to controlling a series protection FET. It is to be appreciated, though, that aspects of the present disclosure can be applied to and implemented in a wide variety of applications.

FIG. 1 is a schematic circuit diagram of a circuit 100 that includes a battery 110 powering a load 120 and that employs a transistor 130 serving as reverse-current protection. FIG. 1 shows an n-channel FET (NFET) 130 in the power path of the circuit 100, but it is to be appreciated that a p-channel FET could be employed instead of the NFET, with corresponding changes in circuit operation as will be appreciated by those of skill in the art. The reverse-current protection transistor 130 can also be implemented with other transistor types besides field-effect transistors. In circuit 100, the body diode 135 of NFET 130 is oriented in the direction of normal current flow. The NFET 130 allows current flow in the forward direction, i.e., from the source 140 to the drain 145 of NFET 130 (i.e., from the battery 110 to the load 120), and blocks current in the reverse direction, i.e., from the drain 145 to the source 140 of NFET 130. A controller 160 receives inputs from the source 140 and the drain 145 of the NFET 130. The controller 160 generates a control signal, or gate driver signal, based on the drain-to-source voltage $V_{ds}$. The controller 160 provides the gate driver signal to the gate 150 of the NFET 130. In this way, the controller 160 regulates the drain-to-source voltage $V_{ds}$ in a control loop.

FIG. 4 is a schematic circuit diagram of a circuit 400 that includes a battery 410 powering a load 420 and that employs a transistor 430 serving as reverse-current protection. FIG. 4 shows an n-channel FET (NFET) 430 in the power path of the circuit 400, but it is to be appreciated that a p-channel FET could be employed instead of the NFET, with corresponding changes in circuit operation as will be appreciated by those of skill in the art. The reverse-current protection transistor 430 can also be implemented with other transistor types besides field-effect transistors. In circuit 400, the body diode 435 of NFET 430 is oriented in the direction of normal current flow. The NFET 430 allows current flow in the forward direction, i.e., from the source 440 to the drain 445 of NFET 430 (i.e., from the battery 410 to the load 420), and blocks current in the reverse direction, i.e., from the drain 445 to the source 440 of NFET 430. A controller 460 receives inputs from the source 440 and the drain 445 of the NFET 430. The controller 460 generates a control signal, or gate driver signal, based on the drain-to-source voltage Vds. The controller 460 provides the gate driver signal to the gate 450 of the NFET 430. In this way, the controller 460 regulates the drain-to-source voltage Vds in a control loop.

The difference between the circuits of FIGS. 1 and 4, is that in FIG. 4, ground is not utilized for the return path of current from the load 420 to the battery 410.

In an illustrative aspect of the present disclosure, the controller 160 also receives its power from the voltage drop across the NFET 130, i.e., from the drain-to-source voltage $V_{ds}$.

Figure 2:
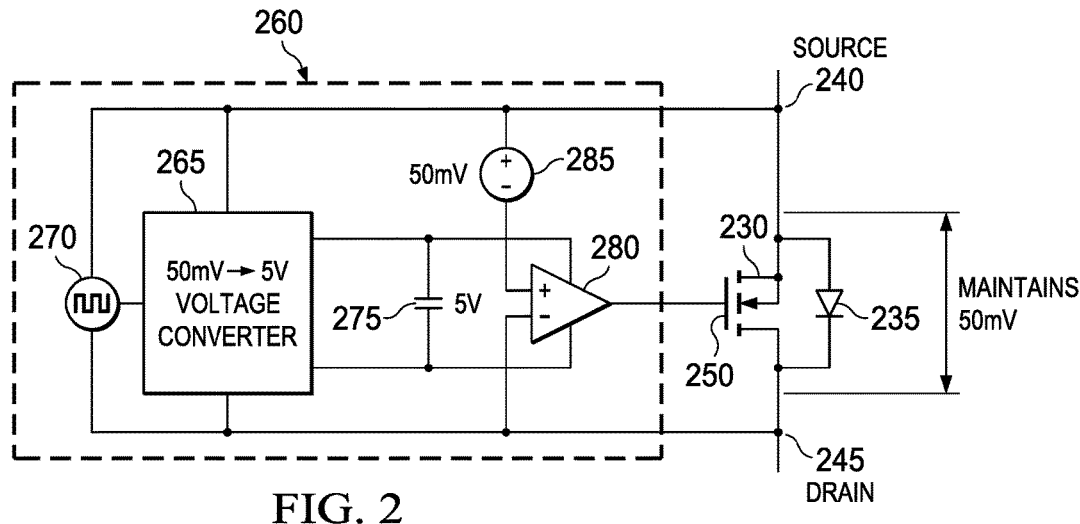
FIG. 2 is a schematic circuit diagram of an NFET transistor and an associated controller.

FIG. 2 is a schematic circuit diagram of an NFET transistor 230 and an associated controller 260. In FIG. 2, NFET 230 corresponds to NFET 130 of FIG. 1, and controller 260 corresponds to controller 160 of FIG. 1. The controller 260 includes a voltage conversion circuit 265, an oscillator 270, a reservoir capacitor 275, a differential amplifier 280, and an offset voltage source 285. The controller 260 receives its power from the voltage drop across the NFET 230, i.e., from the drain-to-source voltage $V_{ds}$. In an illustrative embodiment, the controller 260 receives all of its power from the drain-to-source voltage $V_{ds}$, without receiving any additional power from other power sources. The voltage conversion circuit 265 receives the drain-to-source voltage $V_{ds}$ of the NFET 230 and converts it to a voltage level appropriate for powering components of the controller, such as differential amplifier 280. In certain illustrative embodiments of the present disclosure, the voltage converter 265 comprises a capacitive charge pump circuit, while in other illustrative embodiments, the voltage conversion circuit 265 comprises an inductive voltage boost circuit. The oscillator 270 receives the drain-to-source voltage $V_{ds}$ of the NFET 230, generates an oscillating signal, and provides the oscillating signal to the voltage conversion circuit 265 to drive the charge pump circuit. The oscillating signal generated by the oscillator 270 can be a square wave, a pulsed DC signal, or any other type of oscillating signal. The reservoir capacitor 275 stores the supply voltage generated by the voltage conversion circuit 265. The reservoir capacitor 275 can be either internal to the controller 260 or can be external. The controller 260 can be implemented in some cases without the reservoir capacitor. The supply voltage generated by the voltage converter 265 is used to power a control circuit, represented in FIG. 2 by the differential amplifier 280 and the offset voltage source 285, that regulates the drain-to-source voltage $V_{ds}$ of the NFET 230 by controlling the voltage of a control signal provided to the gate 250 of the NFET 230 in a control loop based on said drain-to-source voltage $V_{ds}$.

The voltage generated by the voltage converter 265 used to power the differential amplifier 280 is isolated from ground, whether or not the reservoir capacitor 275 is utilized. In the illustrative embodiment of FIG. 2, the voltage of the offset voltage source 285 is added to the source voltage of the NFET 230 and the summed voltage signal is provided to the non-inverting input of the differential amplifier 280. The voltage level of the offset voltage source 285 corresponds to a target voltage level of the drain-to-source voltage $V_{ds}$. The drain voltage of the NFET 230 is provided to the inverting input of the differential amplifier 280. The output of the differential amplifier 280 is provided to the gate 250 of the NFET 230. In this way, the control circuit represented by the differential amplifier 280 and the offset voltage source 285 works to maintain the drain-to-source voltage $V_{ds}$ at a voltage level substantially corresponding to the target voltage represented by the offset voltage source 285.

In operation, at startup, because of the body diode orientation of the N-channel FET 230, there will be initial current flowing through the body diode 235 if the load 120 is on. Therefore, even if the controller 260 is not powered, this will not interrupt the flow of current. However, as the current starts to flow through the body diode 235, a voltage will be generated across the source 240 and drain 245 of the NFET 230, specifically the voltage of a PN junction. This voltage can vary from NFET to NFET, and across temperatures, but nominally may be around 0.5V-0.7V. This voltage is also seen by the controller 260, across the source terminal 240 and the drain terminal 245 of the NFET 230. Using this voltage, the controller 260 will have enough voltage to turn on and startup its own circuitry, namely the voltage conversion circuit 265 and the oscillator 270.

The voltage conversion circuit 265 uses the body voltage, i.e., the drain-to-source voltage $V_{ds}$ (0.5V-0.7V) to generate an internal supply voltage. In the illustrative embodiment of FIG. 2, this internal supply voltage is shown to be approximately 5V, but this voltage level is merely illustrative and other internal supply voltage levels can be used. In an illustrative embodiment, the voltage converter 265 generates anywhere from approximately 0.5 mWatts to 10 mWatts. The controller 260 then enters the regulation mode, wherein it varies the gate voltage of the NFET 230 in a controlled loop to keep the drain-to-source voltage $V_{ds}$ at the desired target level. In the illustrative embodiment of FIG. 2, this target voltage is shown to be 50 mV, but this voltage level is merely illustrative and other target $V_{ds}$ levels can be used. In an illustrative embodiment, the controller 260 maintains the gate voltage at a level that is just high enough to give sufficient $V_{ds}$ to keep the voltage conversion circuit 265 running and generating the internal supply voltage (5V). As mentioned, this internal supply voltage is used to power the differential amplifier 280 and/or other control circuitry.

The regulated source-to-drain voltage $V_{ds}$ of the NFET 230 is dependent on the threshold voltage ($V_{threshold}$) of the NFET device used. Therefore, the regulation self-adjusts when $V_{threshold}$ fluctuates across temperature by varying the gate voltage to match the $V_{ds}$.

In the illustrative embodiment of FIG. 2, the controller 260 is shown to include a single voltage conversion circuit 265. In an alternative embodiment, the controller 260 may include two separate voltage conversion circuits in order to accommodate the two different $V_{ds}$ levels that exist at start-up and in the regulation mode. For example, the controller 260 can include a first voltage conversion circuit configured to receive a $V_{ds}$ of 0.5V-0.7V at start-up and convert said $V_{ds}$ to the level of the internal supply voltage (e.g., 5V), and a second voltage conversion circuit configured to receive a $V_{ds}$ of approximately 50 mV in the regulation mode and convert that $V_{ds}$ to the level of the internal supply voltage. Alternatively a single voltage conversion circuit 265 can be figured to operate at the $V_{ds}$ levels of both the start-up and regulation modes. Similarly, while FIG. 2 shows a single oscillator 270, in an alternative embodiment the controller 260 can include two separate oscillators in order to accommodate the two different $V_{ds}$ levels that exist at start-up and in the regulation mode.

Figure 3:
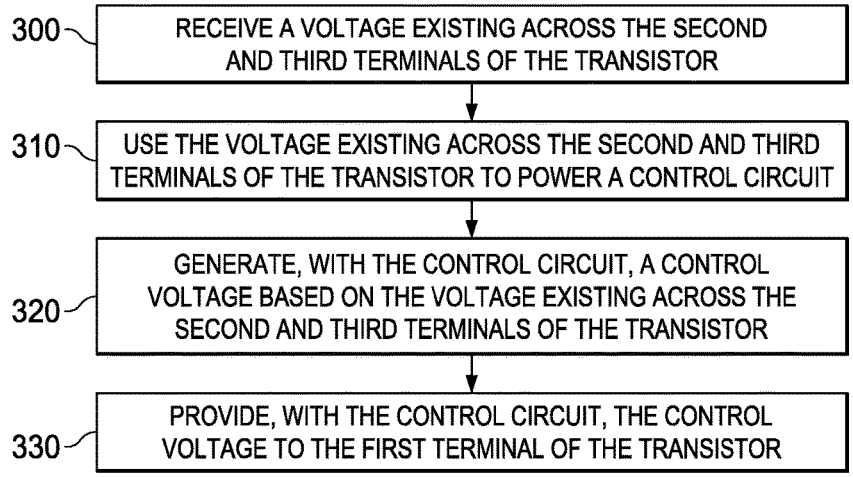
FIG. 3 is a flow chart representing a method of controlling a transistor.

FIG. 3 is a flow chart representing a method of controlling a transistor comprising first, second and third terminals, wherein a voltage level at said first terminal controls in part a current flow from said second terminal to said third terminal. At step 300, a voltage existing across the second and third terminals of the transistor is received. At step 310, the voltage existing across the second and third terminals of the transistor is used to power a control circuit. At step 320, the control circuit generates a control voltage based on the voltage existing across the second and third terminals of the transistor. At step 330, the control circuit provides the control voltage to the first terminal of the transistor.

It is noted that the embodiments disclosed herein are illustrative rather than limiting in nature and that a wide range of variations, modifications, changes, and substitutions are contemplated in the foregoing disclosure. Furthermore, in some instances, some features may be employed without a corresponding use of the other features. Accordingly, it is appropriate that the appended claims be construed broadly and in a manner consistent with the broad inventive concepts disclosed herein.

What is claimed is:

1. A circuit providing reverse current protection comprising:
   a transistor comprising first, second and third terminals, wherein a voltage level at said first terminal controls a current flow from said second terminal to said third terminal; and
   a voltage converter configured to receive a voltage existing across the second and third terminals of the transistor and generating a voltage to power components of a controller, the controller being coupled to a voltage existing at the second and third terminals and isolated from a common ground by passive components and being configured to provide a voltage to the first terminal of the transistor, whereby the controller is operable to regulate the voltage across the second and third terminals of the transistor by regulating the voltage provided to the first terminal.

2. The circuit of claim 1 wherein the received voltage existing across the second and third terminals of the transistor is the controller's sole source of power.

3. The circuit of claim 1 wherein the controller is operable to maintain the voltage across the second and third terminals of the transistor at a predetermined target voltage by regulating the voltage provided to the first terminal of the transistor.

4. The circuit of claim 3 wherein said predetermined target voltage corresponds to a minimum voltage required to power the components of the controller.

5. The circuit of claim 1 wherein the transistor comprises a field-effect transistor (FET) and wherein said first terminal comprises the gate of the FET.

6. The circuit of claim 5 wherein the transistor comprises an n-channel FET (NFET) and wherein said second terminal comprises the source of the NFET, and said third terminal comprises the drain of the NFET.

7. The circuit of claim 1 further comprising a battery powering a load, the battery and the load being isolated from ground.

8. A circuit comprising:
   a transistor comprising first, second and third terminals, wherein a voltage level at said first terminal controls a current flow from said second terminal to said third terminal; and
   a controller comprising:
   a voltage converter configured to receive a voltage existing across the second and third terminals of the transistor and convert said voltage to a power supply voltage that is a higher voltage than said received voltage and isolated from a common ground; and
   a control circuit powered by said power supply voltage and configured to receive the voltage existing across the second and third terminals of the transistor and to provide a control voltage to the first terminal of the transistor, whereby the control circuit is operable to regulate the voltage across the second and third terminals of the transistor by regulating the control voltage provided to the first terminal.

9. The circuit of claim 8 wherein said voltage converter comprises a charge pump circuit configured to receive a voltage existing across the second and third terminals of the transistor and convert said voltage to a power supply voltage that is a higher voltage than said received voltage.

10. The circuit of claim 9 wherein the controller further comprises an oscillator configured to receive a voltage existing across the second and third terminals of the transistor and to generate an oscillating signal, and to provide the oscillating signal to the charge pump to drive the charge pump circuit.

11. The circuit of claim 9 wherein the controller further comprises a reservoir capacitor coupled to receive and store the power supply voltage generated by the charge pump circuit.

12. The circuit of claim 8 wherein the control circuit is operable to maintain the voltage across the second and third terminals of the transistor at a predetermined target voltage by regulating the voltage provided to the first terminal of the transistor.

13. The circuit of claim 12 wherein the control circuit comprises:
   a differential amplifier powered by the power supply voltage and having an inverting input coupled to the third terminal of the transistor and having an output coupled to the first terminal of the transistor; and
   an offset voltage source coupled between the second terminal of the transistor and a non-inverting input of the differential amplifier, the voltage of the offset voltage source corresponding to the target voltage across the second and third terminals of the transistor.

14. The circuit of claim 12 wherein said predetermined target voltage corresponds to a minimum voltage required to power the control circuit.

15. The circuit of claim 8 wherein the received voltage existing across the second and third terminals of the transistor is the control circuit's sole source of power.

16. The circuit of claim 8 wherein the transistor comprises a field-effect transistor (FET) and wherein said first terminal comprises the gate of the FET.

17. The circuit of claim 16 wherein the transistor comprises an n-channel FET (NFET) and wherein said second terminal comprises the source of the NFET, and said third terminal comprises the drain of the NFET.

18. A method of controlling a transistor providing reverse current protection, the transistor comprising first, second and third terminals, wherein a voltage level at said first terminal controls create a current flow from said second terminal to said third terminal, the method comprising:
   receiving, at a voltage converter, a voltage existing across the second and third terminals of the transistor;
   powering a control circuit with an output of the voltage converter;
   using said voltage existing across the second and third terminals of the transistor to power the control circuit using voltage isolated from a common ground;
generating, with the control circuit, a control voltage based on the voltage existing across the second and third terminals of the transistor; and
   providing, with the control circuit, the control voltage to the first terminal of the transistor.

19. The method of claim 18 wherein said generating a control voltage comprises generating a control voltage such that the voltage across the second and third terminals of the transistor is substantially maintained at a predetermined target voltage.

20. The circuit of claim 19 wherein said predetermined target voltage corresponds to a minimum voltage required to power the control circuit.

21. The method of claim 18 wherein the received voltage existing across the second and third terminals of the transistor is the control circuit's sole source of power.

* * * * *